(12) United States Patent
Theel

(10) Patent No.: US 6,920,076 B2
(45) Date of Patent: Jul. 19, 2005

(54) INTERLAYERED POWER BUS FOR SEMICONDUCTOR DEVICE

(75) Inventor: Wayne Arthur Theel, Plymouth, MN (US)

(73) Assignee: Union Semiconductor Technology Corporation, Plymouth, MN (US)

( * ) Notice: Subject to any disclaimer, the term of this patent is extended or adjusted under 35 U.S.C. 154(b) by 66 days.

(21) Appl. No.: 10/377,372

(22) Filed: Feb. 28, 2003

(65) Prior Publication Data

US 2004/0170043 A1 Sep. 2, 2004

(51) Int. Cl.[7] .................................................. G11C 7/00
(52) U.S. Cl. ........................................ 365/226; 365/51
(58) Field of Search .......................... 365/226, 51, 227, 365/229

(56) References Cited

U.S. PATENT DOCUMENTS

| | | | |
|---|---|---|---|
| 4,104,734 A | 8/1978 | Herndon | 365/207 |
| 4,339,809 A | 7/1982 | Stewart | 365/206 |
| 4,899,309 A | 2/1990 | Kitazawa et al. | 365/189.01 |
| 5,040,151 A * | 8/1991 | Miyawaki et al. | 365/226 |
| 5,239,510 A | 8/1993 | Hill | 365/226 |
| 5,321,658 A | 6/1994 | Ishimura et al. | 365/206 |
| 5,390,140 A | 2/1995 | Tomishima et al. | 365/51 |
| 5,615,162 A | 3/1997 | Houston | 365/226 |
| 5,798,977 A | 8/1998 | Kwon | 365/226 |
| 6,049,499 A | 4/2000 | Sukegawa et al. | 365/228 |
| 6,163,493 A | 12/2000 | Yamagata et al. | 365/226 |
| 6,178,129 B1 | 1/2001 | Chen | 365/206 |
| 6,307,802 B1 | 10/2001 | Manning | 365/226 |
| 6,349,067 B1 | 2/2002 | Hsu et al. | 365/206 |
| 6,366,513 B1 * | 4/2002 | Wang | 365/210 |
| 6,459,639 B2 | 10/2002 | Nishimura | 365/207 |
| 6,515,918 B2 | 2/2003 | Mizuno et al. | 365/189.09 |

FOREIGN PATENT DOCUMENTS

| | | |
|---|---|---|
| US | 0022400 | 9/2001 |
| US | 0133786 | 9/2002 |

* cited by examiner

*Primary Examiner*—Van Thu Nguyen
*Assistant Examiner*—Pho M. Luu
(74) *Attorney, Agent, or Firm*—Jones Day

(57) ABSTRACT

A semiconductor device includes a first power pad, a second power pad, a first adjacent bus pair, and a second adjacent bus pair. The first power pad is operable to supply a first potential, and the second power pad operable to supply a second potential. The first adjacent bus pair is disposed on a first layer of the semiconductor device and connected to the first and second power pad. The second adjacent bus pair is disposed on the second layer of the semiconductor device and is connected to the first and second power pads, and is also underlying the first adjacent bus pair.

8 Claims, 6 Drawing Sheets

US 6,920,076 B2

INTERLAYERED POWER BUS FOR SEMICONDUCTOR DEVICE

This Application is related to co-pending U.S. patent application Ser. No. 10/377,371, filed on Feb. 28, 2003, entitled "Semiconductor Device Power Bus System And Method".

BACKGROUND

1. Field of the Invention

The invention relates in general to semiconductor devices, and more particularly to integrated circuit power distribution systems and methods.

2. Description of the Related Art

A semiconductor device, such as a semiconductor memory device, typically comprises a memory array, input/output (I/O) circuits, word drive circuits, bit select circuits, sense amplifiers, sense amplifier drive circuits, and other analog and digital circuits. All of these circuits receive power from a power distribution system in the integrated circuit.

Data stored in the memory array is typically read by selecting a memory cell and using a sense amplifier to compare a resulting voltage or current to a reference voltage or current. Typically, the I/O circuits and word drive circuits are optimized for speed and may change states rapidly. The rapid change of states often generates current transients or voltage transients in the power distribution system of the semiconductor device. These resulting transients may cause performance degradation in particular circuits, such as the bit select circuits, sense amplifiers, sense amplifier drive circuits, or other sensitive analog or digital circuits.

Typically, the power distribution system comprises a pair of busses, with one bus at a higher potential than the other bus. Depending on the architecture of the bus pair, the conductance of the busses may vary, which may also cause performance degradation in circuits powered by the bus pair.

SUMMARY

A semiconductor device comprises a first power pad, a second power pad, and a first power network. The first power pad is operable to supply a first potential, and the second power pad operable to supply a second potential. The first power network comprising first busses and second busses interlayered on first and second layers of the semiconductor device. The first busses are connected to the first power pad and the second busses are connected to the second power pad.

A method of providing power to an integrated circuit comprises the steps of interlayering first busses on first and second layers of the integrated circuit, interlayering second busses on the first and second layers of the integrated circuit, connecting the first busses to a first potential, and connecting the second busses to a second potential.

A semiconductor device comprises a first power pad, a second power pad, a first adjacent bus pair, and a second adjacent bus pair. The first power pad is operable to supply a first potential, and the second power pad operable to supply a second potential. The first adjacent bus pair is disposed on a first layer of the semiconductor device and is connected to the first and second power pads. The second adjacent bus pair is disposed on the second layer of the semiconductor device and is connected to the first and second power pads. The second adjacent bus pair is underlying the first adjacent bus pair in an elongated direction.

DETAILED DESCRIPTION

Figure 1:
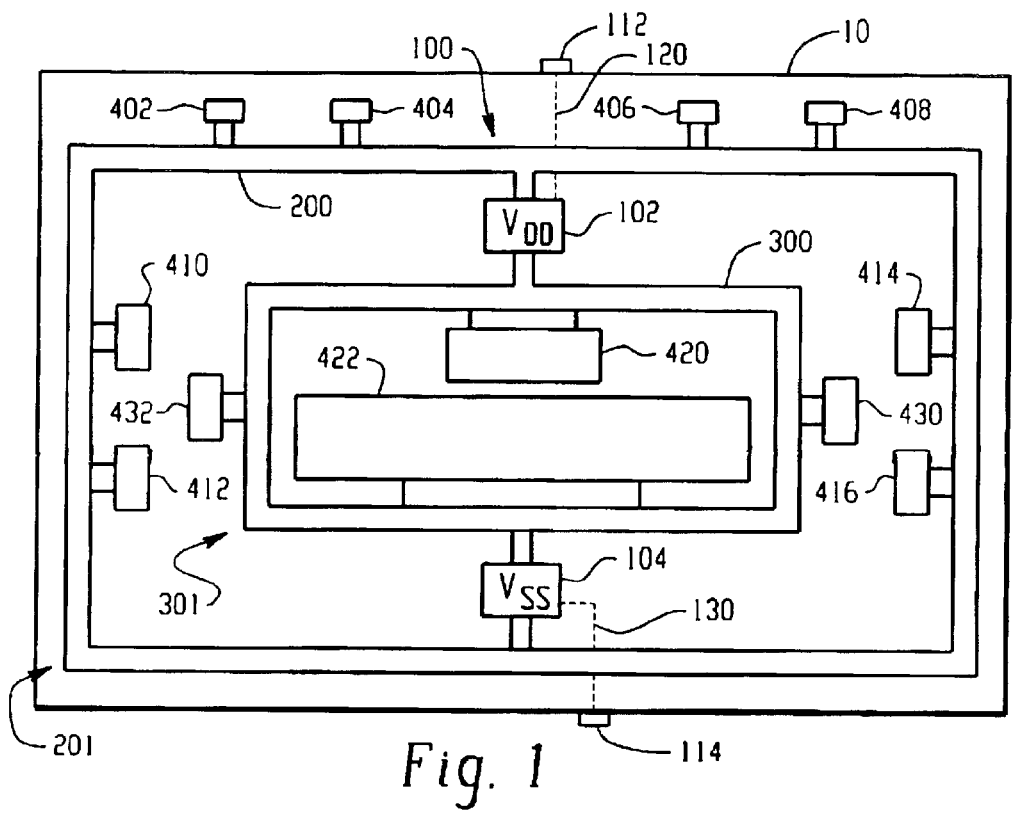
FIG. 1 is a block diagram of a semiconductor device including a power supply system.

FIG. 1 is a block diagram of a semiconductor device 10 including a power supply system 100. The semiconductor device 10 includes a first power pad 102 that supplies a first potential $V_{DD}$, and a second power pad 104 that supplies a second potential $V_{SS}$. The first potential $V_{DD}$ is typically a positive voltage relative to the second potential $V_{SS}$. The second potential $V_{SS}$ is typically a ground potential or a negative voltage potential. Voltage sources may be provided from external sources via a first voltage pin 112 that is connected to the first power pad 102 via a lead 120, and a second voltage pin 130 that is connected to the second power pad 104 via a lead 130.

The semiconductor device 10 may comprise a semiconductor memory device, such as a DRAM integrated circuit, or an MRAM integrated circuit. The semiconductor device 10 may also comprise other devices, such as processors, controllers, and the like.

The power supply system 100 illustratively comprises a first power network 200 that defines a first periphery 201, and a second power network 300 that defines a second periphery 301 within the first periphery 201. The second periphery 301 may also be symmetrically disposed from one or both of the power pads 102 and 104. Both of the first and second power networks 200 and 300 are connected to the first and second power pads 102 and 104.

The first power network 200 provides power to a first plurality of circuits on the semiconductor device 10, including input/output (I/O) circuits 402, 404, 406 and 408, and word drive circuits 410, 412, 414, and 416. The second power network 300 provides power to a second plurality of circuits on the semiconductor device 10, including sense amplifier circuits 420, the memory array 422, and the bit select circuits 430 and 432.

Figure 2:
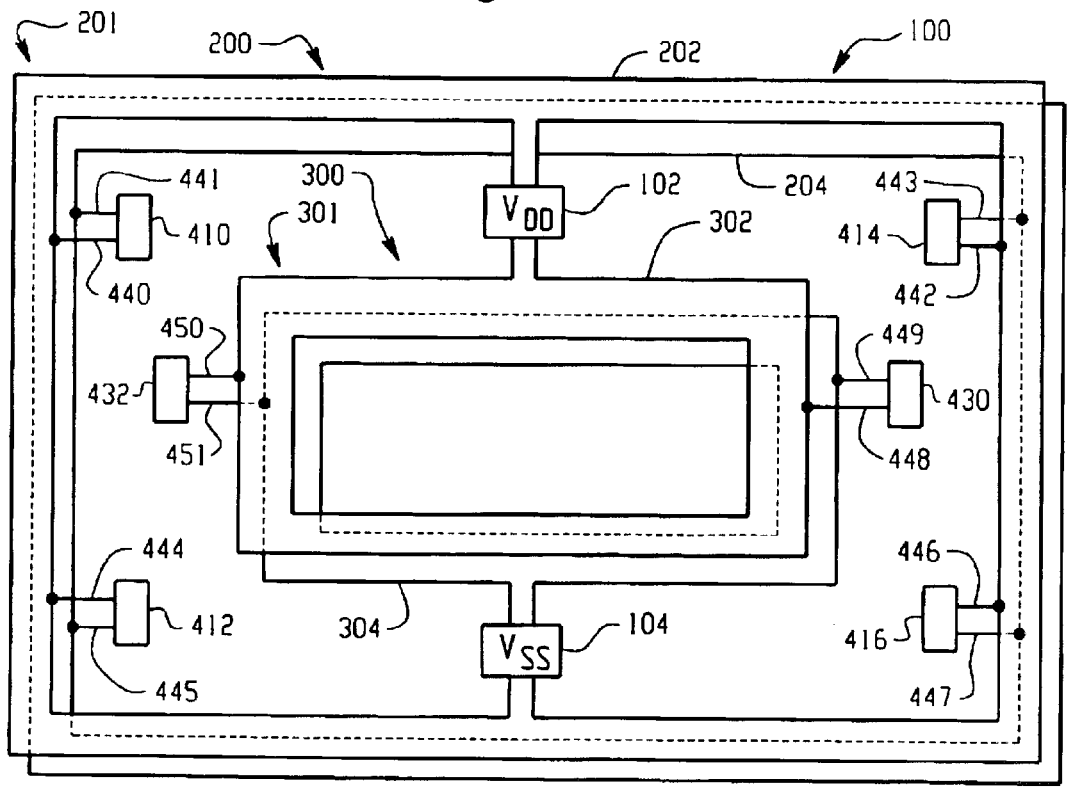
FIG. 2 is a block diagram of an embodiment of a first and second power network of the power supply system.

In one embodiment, the first and second power networks comprise pairs of layered traces. FIG. 2 is a block diagram of the first and second power networks 200 and 300 of the power supply system 100 according to this embodiment.

The first power network 200 comprises a first power bus 202 connected to the first power pad 102, and a second power bus 204 connected to the second power pad 104. Likewise, the second power network 300 comprises a third power bus 302 connected to the first power pad 102, and a fourth power bus 304 connected to the second power pad 104. The first and third power busses 202 and 302 may coextensively overlay the second and fourth power busses 204 and 304; however, for illustrative purposes, the first and third power busses 202 and 302 are slightly offset from the second and fourth power busses 204 and 304.

Typically, the semiconductor device 10 comprises multiple layers, and thus the first and second power busses 202 and 204 and the third and fourth power busses 302 and 304 may be separated by one or more layers. In another embodiment, however, the first and second power busses 202 and 204 and the third and fourth power busses 302 and 304 may be disposed on the same layer and separated by an insulating material.

The power busses 202, 204, 302 and 304 are typically formed from a low resistance conductor, such as aluminum, copper, gold, or other conductive metal or material, and deposited in a loop manner as shown to define the peripheries 201 and 301. Word drive circuits 410, 412, 414 and 416 are connected to the first and second power busses 202 and 204, and the bit selection circuits 430 and 432 are connected to the third and fourth power busses 302 and 304. Illustratively, the word drive circuit 410 is connected to the first power bus 202 by lead 440, and to the second power bus 204 by lead 441. The remaining word drive circuits 412, 414, and 416 are connected to the first and second power busses 202 and 204 by leads 442, 443, 444, 445, 446, and 447 in a similar manner. The bit selection circuit 430 is connected to the third power bus 302 by a lead 448 and to the fourth power bus 304 by a lead 449; likewise, the bit selection circuit 432 is connected to the third and fourth power busses 302 and 304 by the leads 450 and 451 in a similar manner.

The I/O circuits 402, 404, 406 and 408, the sense amplifier circuits 420, and the memory array 422 are connected to the first and second power networks 100 and 200 in a similar manner, but are not depicted in FIG. 2 so as to avoid congestion in the drawings.

In operation, the I/O circuits 402, 404, 406 and 408, and the word drive circuits 410, 412, 414, and 416 may change states rapidly, which in turn may cause voltage or current transients in the first power network 200. For example, a state change in the word drive circuit 414 may cause a voltage transient of several millivolts at the node defined by the first power bus 202 and the lead 442. The transient or noise on the power system 200 caused by the I/O circuits 402, 404, 406 and 408, and word drive circuits 410, 412, 414, and 416 may be of such magnitude to cause performance degradation in more sensitive circuits, such as the sense amplifier circuits 420, the memory array 422, and the bit select circuits 430 and 432.

The power system 100 of FIG. 1 reduces or eliminates the effects of such noise. As the transient propagates over the first power bus 202 and back to the first power pad 102, the magnitude of the transient attenuates due to the inherent bus impedance.

Upon reaching the first power pad 102, the transient may be clamped to $V_{DD}$ at the first power pad 102. Accordingly, the transient is prevented from propagating over the second power network 300 and affecting the performance of the sense amplifier circuits 420, the memory array 422, and the bit select circuits 430 and 432. If the transient is of a sufficient magnitude, however, then the voltage at the first power pad 102 may be temporarily affected by the transient. When this occurs, the transient is symmetrically distributed over the second power network 300. Because the circuits connected to the second power network 300 are referenced from the first power pad 102, the transient is superimposed on the third power bus 302 and distributed equally to all circuits connected to the third power bus 302. The equal distribution over the third power bus 302 results in common voltage variations among the sense amplifier circuits 420, the memory array 422, and the bit select circuits 430 and 432, and thus minimizes or eliminates performance degradation that may result from a voltage imbalance or voltage transient on the third power bus 302.

In a similar manner, voltage or current transients induced on the second power bus 204 in the first power network 200 are likewise prevented from propagating over the second power network 300 by being clamped at the second power pad 104, or performance degradation in the sense amplifier circuits 420, the memory array 422, and the bit select circuits 430 and 432 is minimized or eliminated by the common distribution of the transient through the fourth power bus 304.

Thus, circuits with a higher tolerance to power bus noise, or noise inducing circuits, may be powered by the first power network 200, and noise sensitive circuits may be powered by the second power network 300. Accordingly, performance degradation in the noise sensitive circuits may be minimized or even eliminated.

Another source of performance degradation for circuits connected to a power system may be caused by conductance variations in a bus trace, or by conductance variations between a pair of bus traces, such as power busses 202 and 204. Typically, conductance variations are caused by non-uniform bus traces, bus trace thickness, or by dividing a bus pair between one or more layers in the semiconductor device. Other sources of conductance variations in the bus traces may also cause performance degradation in circuits connected to the bus traces.

Figure 3:
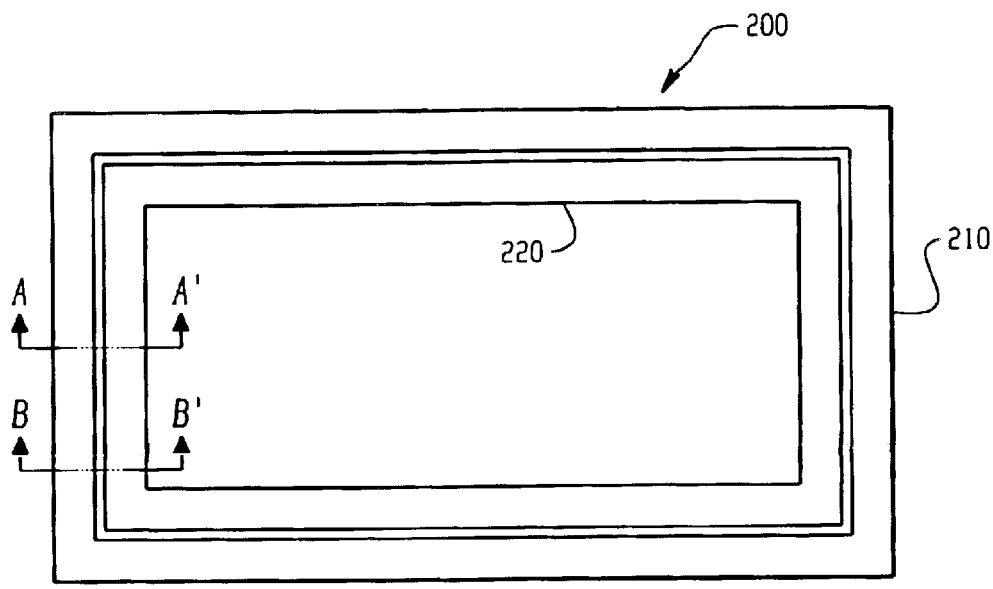
FIGS. 3–5 are diagrams of an interlayered bus pair in the first power network.
Figure 4:
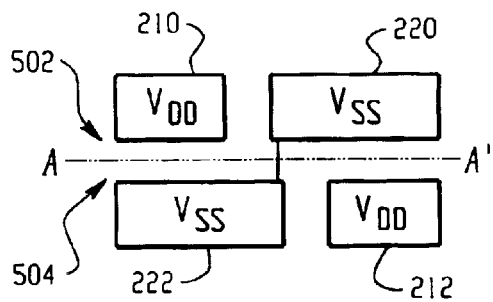
Figure 5:
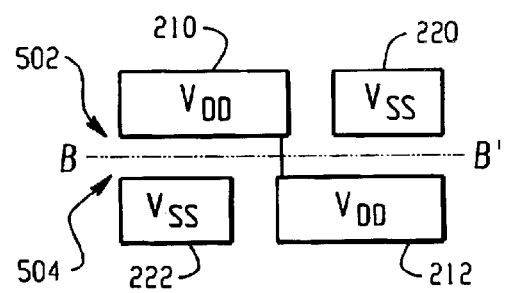

FIGS. 3–5 are block diagrams of an interlayered bus pair in the first power network 200. The power network 200 of FIGS. 3–5 minimizes conductance variations in a power bus. In the embodiment of FIGS. 3–5, the first power network 200 comprises first and second interlayered busses. The first interlayered bus comprises first and second subbusses 210 and 212 interlayered on first and second layers 502 and 504 of the semiconductor device 10. Similarly, the second interlayered bus comprises third and fourth subbusses 220 and 222 interlayered on first and second layers 502 and 504 of the semiconductor device 10.

The first and second subbusses 210 and 212 are connected to the first power pad 102 and thus are at the potential $V_{DD}$, and the third and fourth subbusses 220 and 222 are connected to the second power pad 104 and thus are at the potential $V_{SS}$. The first and third subbusses 210 and 220 may be juxtaposed on the first layer 502 of the semiconductor device 10, and the second and fourth subbusses 212 and 222 may be juxtaposed on the second layer 504 of the semiconductor device 10.

As shown in FIGS. 3 and 4, the width of the third and fourth subbusses 220 and 222 may extend in an overlying relationship at one or more locations in the power network 200 so that the third subbus 220 may be connected to the fourth subbus 222 through the first and second layers 502 and 504 of the semiconductor device 10. Likewise, as shown in FIGS. 3 and 5, the width of the first and second subbusses 210 and 212 may extend in an overlying relationship at one or more locations in the power network 200 so that the second subbus 210 may be connected to the third subbus 212 through the first and second layers 502 and 504 of the semiconductor device 10. These extensions may alternate and the first and fourth subbusses 210 and 222 and the second and third subbusses 212 and 220 may thus be connected at multiple locations, as indicated by the cross sections AA' and BB' of FIG. 3.

These connections minimize or eliminate the conductance variations caused by nonuniform bus traces, bus trace thickness, or by dividing the bus pair between one or more layers in the semiconductor device 10. Thus, by vertically splitting the busses 202 and 204 of FIG. 1 in the manner as shown in FIG. 3, the total conductance of each split bus is equalized.

Figure 6:
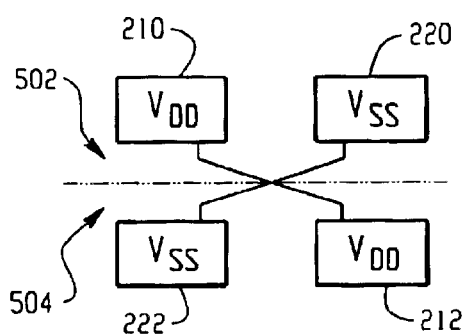
FIG. 6 is a cross section view of another embodiment of the interlayered bus pair.

FIG. 6 is a cross section view of another embodiment of the interlayered bus pair in the power network 200. In this embodiment, the width of the busses 210, 212, 220, and 222 is uniform, and the busses 210 and 220 overlap the busses 222 and 212 coextensively. The connection of the first and second subbusses 210 and 212 is facilitated by a cross connection between the first and second layers 502 and 504 at a first location. Likewise, the connection of the third and fourth subbusses 220 and 222 is facilitated by a cross connection between the first and second layers 502 and 504 at a second location. The cross connections may alternate and be evenly distributed along the subbusses 210, 212, 220 and 222.

Figure 7:
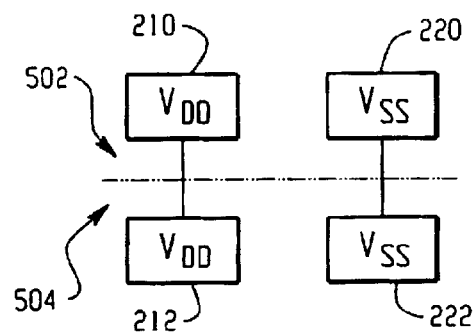
FIG. 7 is a cross section view of another embodiment of the interlayered bus pair.

FIG. 7 is a cross section view of another embodiment of the interlayered bus pair in the power network 200. In this embodiment, the first and second subbusses 210 and 212 are vertically disposed on the first and second layers 502 and 504 so that the first subbus 210 to coextensively overlaps the second subbus 212. Likewise, the third and fourth subbusses 220 and 222 are vertically disposed on the first and second layers 502 and 504 so that the third subbus 220 coextensively overlaps the fourth subbus 222. The vertical and horizontal disposition of the subbusses 210, 212, 220, and 222 of FIG. 7 provide for reduced line-to-line capacitance as compared to the vertical and horizontal disposition of the subbusses 210, 212, 220, and 222 of FIGS. 4–6. Thus, depending on the particular requirements of semiconductor device 10, the line-to-line capacitance of the power system 200 may be increased or decreased by selecting the vertical and horizontal disposition of the subbusses 210, 212, 220 and 222.

The first power network 200 of FIGS. 3–6 may be utilized as the main power network for a semiconductor device and thus provide power to all circuits in the semiconductor device. In another embodiment, however, the first power network 200 of FIGS. 3–6 may be combined with the second power network 300 of FIGS. 1 and 2 to minimize or eliminate performance degradation in circuits connected to the second power network 300 that may result from a voltage imbalance or other transient induced on the first power network 200. Furthermore, the second power network 300 of FIGS. 1 and 2 may also be realized by the interlayered adjacent bus pair as described with reference to FIGS. 3–6. Thus, the second power network 300 may comprise fifth, sixth, seventh and eight subbusses arranged in manner similar to the first, second, third and fourth subbusses 210, 212, 220, and 222 of the first power network 200.

While the first power network 200 of FIGS. 3–7 has been described as being distributed over two layers, the first power network may be distribute over additional layers. For example, the first and second subbusses 210 and 212 may be disposed on first and second layers, respectively, and the third and fourth subbusses 220 and 222 may be disposed on first and third layers, respectively. In another embodiment, the first and fourth subbusses 210 and 222 may be disposed on first and second layers, respectively, and the second and third subbusses 212 and 220 may be disposed on first and third layers, respectively. And in yet another embodiment, multiple subbusses may be disposed in multiple layers, e.g., six subbusses may be disposed over three layers, or twelve subbusses may be disposed over six layers.

Figure 8:
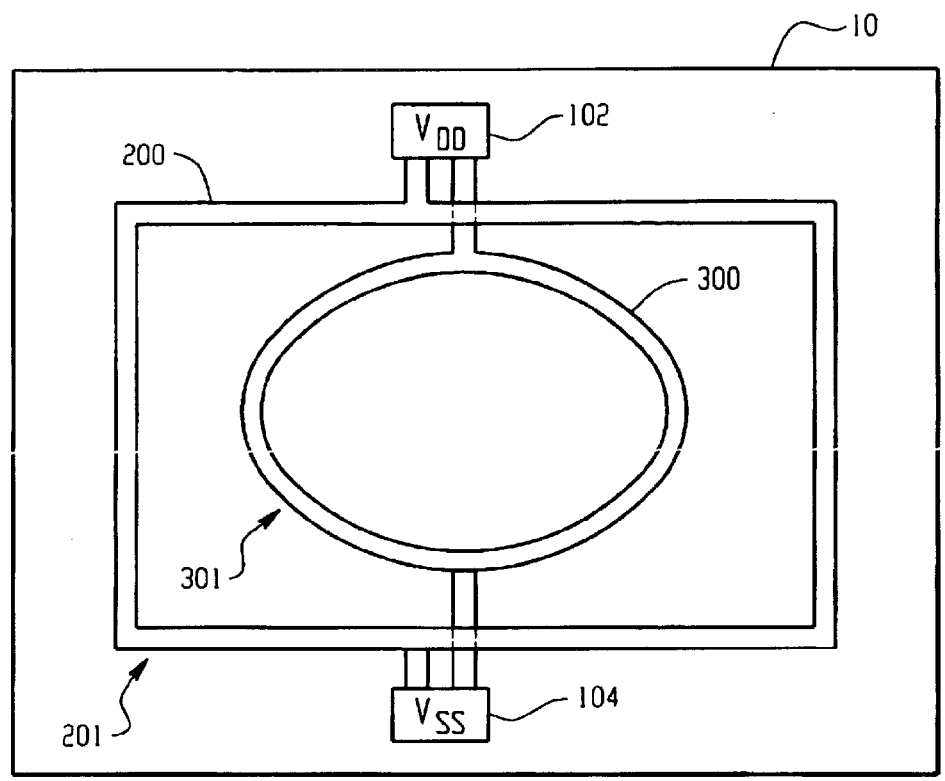
FIG. 8 is a block diagram of another embodiment of the power supply system in the semiconductor device.

While the geometry of the first and second peripheries 201 and 301 of FIGS. 1 and 3 are rectangular, other geometric patterns may also be used. FIG. 8 is a block diagram of another embodiment of the power supply system 100 in the semiconductor device 10. In this embodiment, the geometry of the first periphery 201 is rectangular, and the geometry of the second periphery 301 is circular. Other geometric patterns for the first and second peripheries 201 and 301 may also be used.

Furthermore, the first and second power pads 102 and 104 need not be placed between the first and second power networks 200 and 300 as depicted in FIG. 1. For example, in the embodiment of FIG. 8, the first and second power pads 102 and 104 are located outside of the peripheries 201 and 302 defined by the first and second power networks 200 and 300, respectively. In all other respects, the first and second power networks 200 and 300 may be constructed and may operate in a similar manner as described with reference to FIGS. 1–7.

Figure 9:
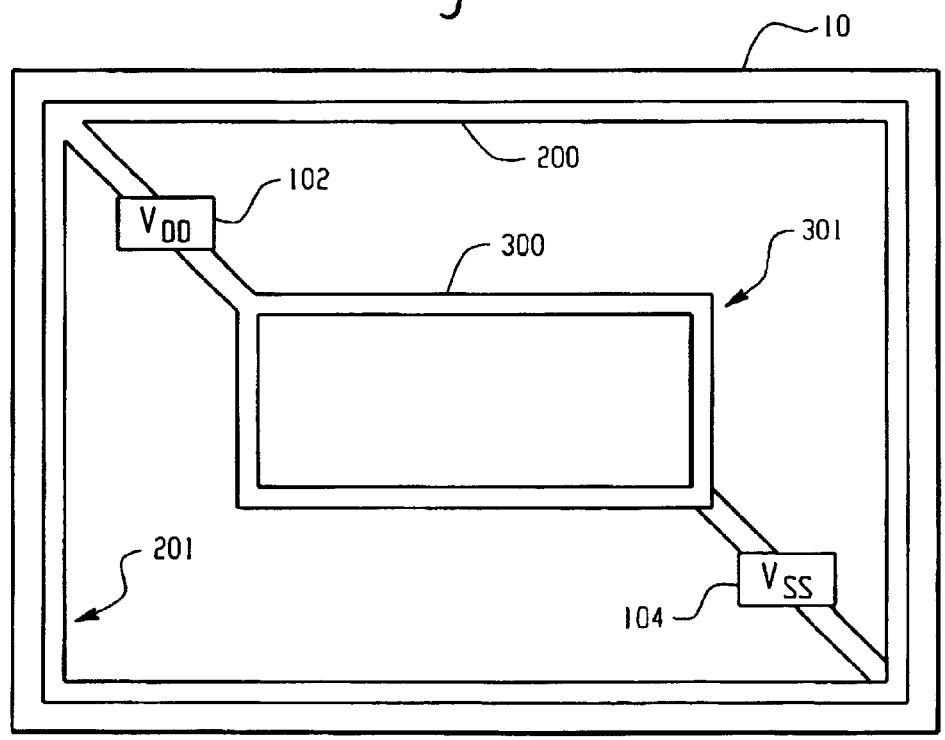
FIG. 9 is a block diagram of another embodiment of the power supply system in the semiconductor device.

The first and second power pads 102 and 104 may also be placed at other locations on the semiconductor device 10. FIG. 9 is a block diagram of another embodiment of the power supply system 100 in the semiconductor device 10. In this embodiment, the first power pad 102 is positioned in the upper left quadrant of the rectangle area defined by the first periphery 201 of the first power network 200, and the second power pad 104 is positioned in the lower right quadrant of the area defined by the first periphery 201. In all other respects, the first and second power networks 200 and 300 may be constructed and may operate in a similar manner as described with reference to FIGS. 1–8.

Figure 10:
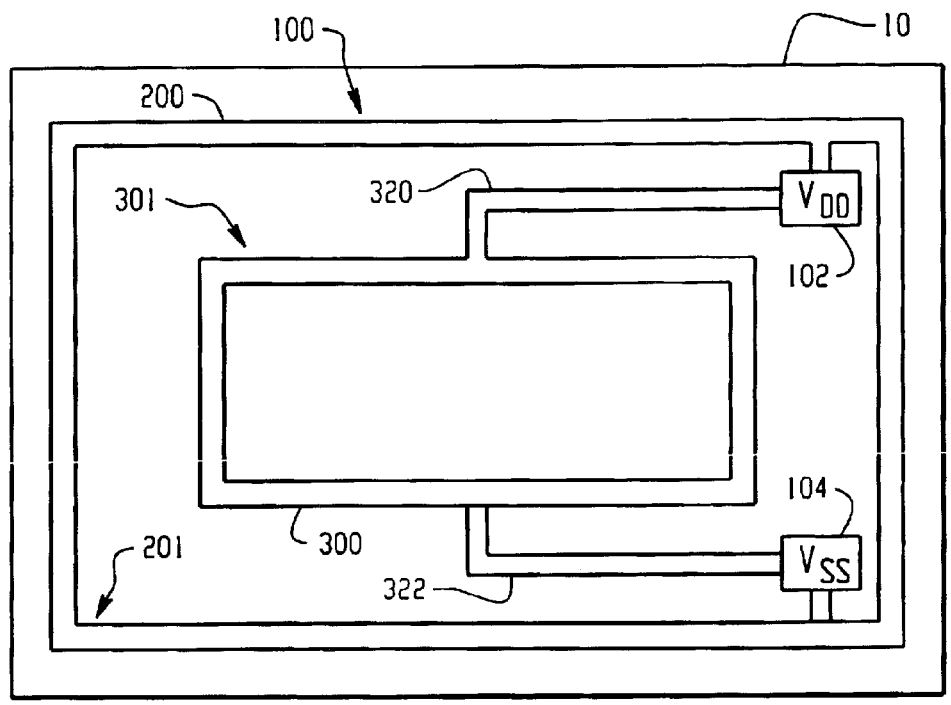
FIG. 10 is a block diagram of another embodiment of the power supply system in the semiconductor device.

Typically, circuits that induce noise on a power system, or circuits that have a relatively high noise tolerance, will be connected to the first power network 200. Accordingly, the first power network 200 can be asymmetrically disposed from the first and second power pads 102 and 104, as depicted in FIG. 10, which is a block diagram of another embodiment of the power supply system 100 in the semiconductor device 10. In this embodiment, the second power network 300 is symmetrically disposed between the first and second power pads 102 and 104 by the addition of traces 320 and 322. One or both of the first power network 200 and the second power network 300 may comprise overlapping busses as described with reference to FIGS. 1 and 2, or interlayered busses as described with reference to FIGS. 3–6. In all other respects, the first and second power networks 200 and 300 may be constructed and may operate in a similar manner as described with reference to FIGS. 1–9.

Figure 11:
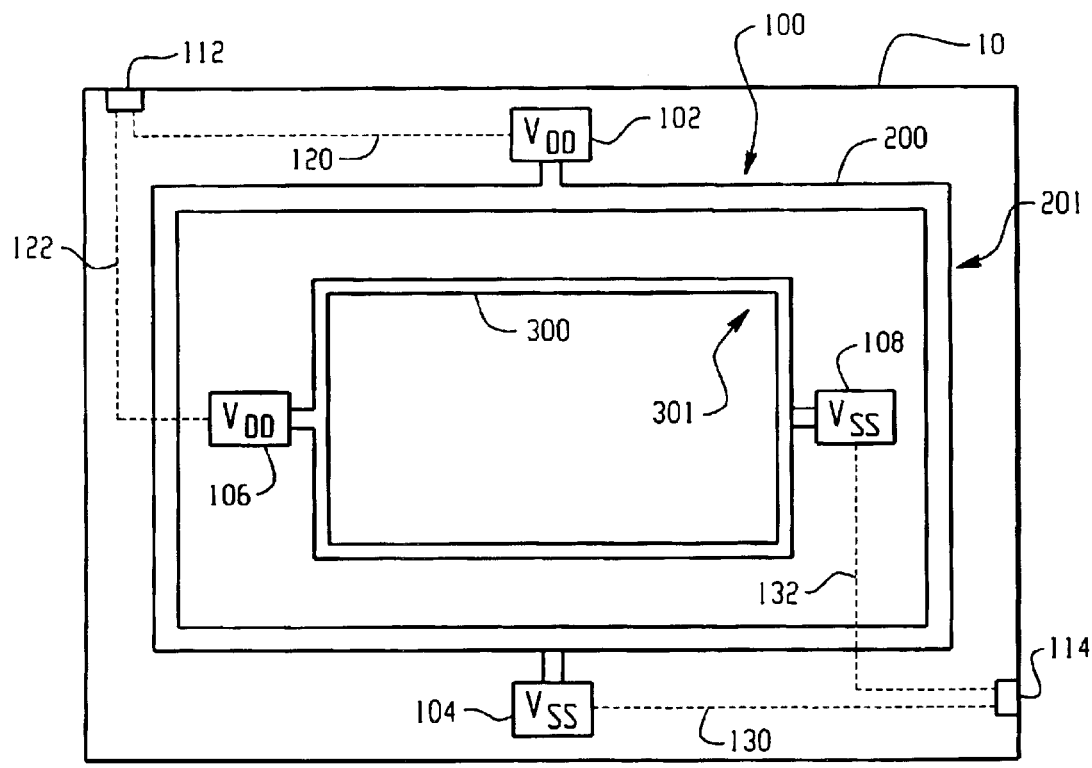
FIG. 11 is a block diagram of another embodiment of the power supply system in the semiconductor device.

Additionally, more than one pair of first and second power pads 102 and 104 may be provided on the semiconductor device 10. FIG. 11 is a block diagram of another embodiment of the power supply system 100 in the semiconductor device 10. In this embodiment, the first power pad 102 is connected to the first voltage pin 112 via a connection 120, and the second power pad 104 is connected to the second voltage pin 114 via a connection 130. The first and second power pads 102 and 104 provide potentials $V_{DD}$ and $V_{SS}$, respectively, to the first power network 200.

A third power pad 106 is also connected to the first pin 112 via a connection 122, and a fourth power pad 108 is also connected to the second pin 114 via a connection 132. The third and fourth power pads 106 and 108 provide potentials $V_{DD}$ and $V_{SS}$, respectively, to the second power network 300. In this embodiment, transients induced in the first power network 200 on the $V_{DD}$ bus must propagate back to the first power pad 102, and through the connections 120 and 122 before reaching the third power pad 106. Accordingly, the transients undergo further attenuation due to the inherent impedance of the connections 120 and 122, and may also be clamped by the first pin 112. Likewise, transients induced in the first power network 200 on the $V_{SS}$ bus must propagate back to the second power pad 104, and through the connections 130 and 132 before reaching the fourth power pad 108. Accordingly, the transients undergo further attenuation due to the inherent impedance of the connections 130 and 132, and may also be clamped by the second pin 114. In all other respects, the first and second power networks 200 and 300 may be constructed and may operate in a similar manner as described with reference to FIGS. 1–10.

Figure 12:
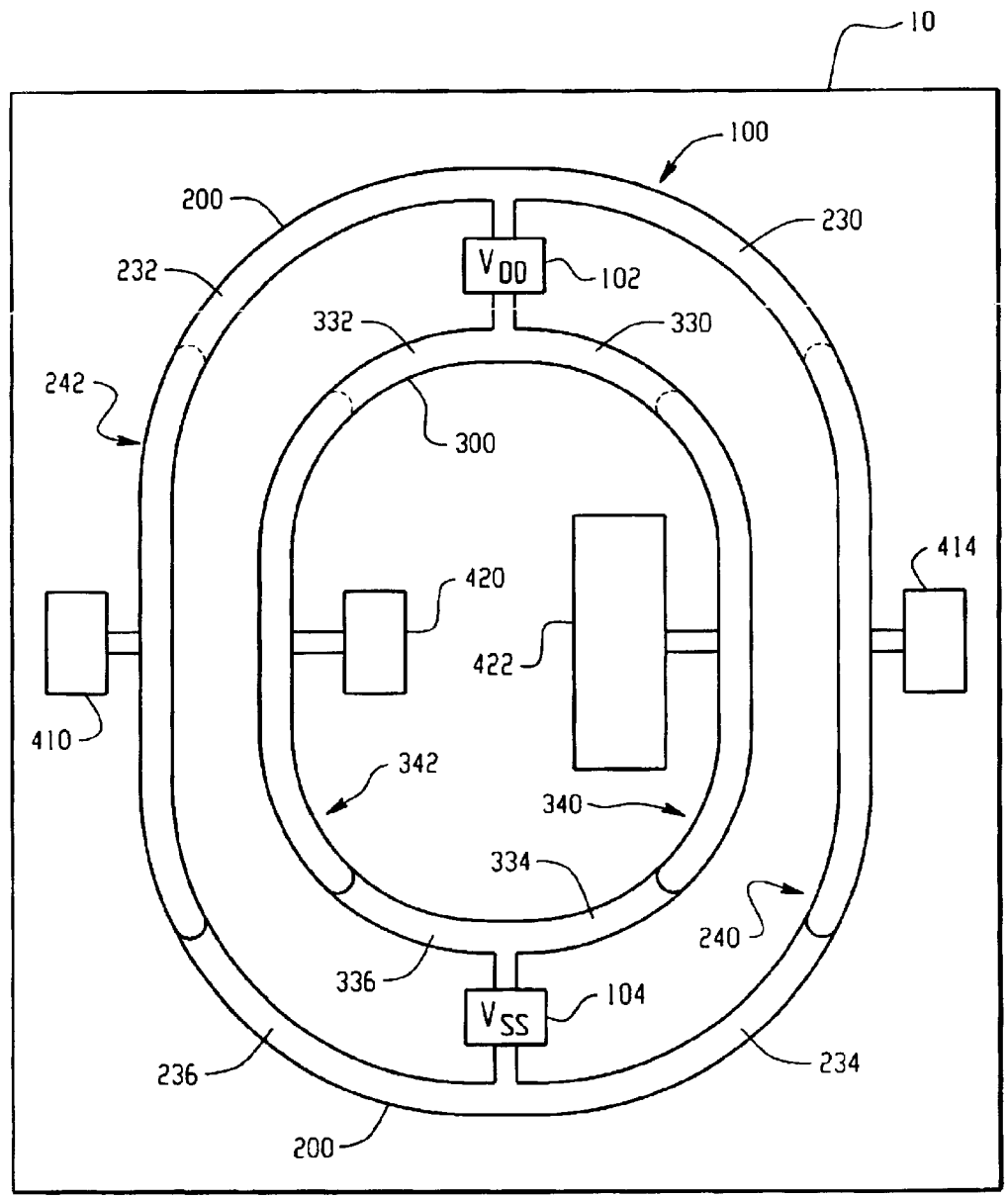
FIG. 12 is a block diagram of another embodiment of the power supply system in the semiconductor device.

The embodiments of FIGS. 1–11 have depicted looped bus traces defining first and second peripheries 201 and 301. However, other bus traces may also be used. FIG. 12 is a block diagram of another embodiment of the power supply system 100 in the semiconductor device 10. In this embodiment, the first power network 200 comprises a first outer bus extension 230 disposed on a first side of the semiconductor device 10 and a second outer bus extension 232 disposed on a second side of the semiconductor device 10. The first and second outer bus extensions 230 and 232 are connected to the first power pad 102.

Likewise, the first power network 200 also comprises a third outer bus extension 234 disposed on the first side of the semiconductor device 10 and a fourth outer bus extension 236 disposed on the second side of the semiconductor device 10. The third and fourth outer bus extensions 234 and 236 are connected to the second power pad 104. The first and third outer bus extensions 230 and 234 overlap to define a first outer overlay region 240, and the second and third outer bus extensions 232 and 236 overlay to define a second outer overlay region 242. Power is provided to circuits connected to the first power network 100, such as word line driver circuits 410 and 414, at or near the first and second outer overlay regions 240 and 242.

Similarly, the second power network 300 comprises a first inner bus extension 330 disposed on the first side of the semiconductor device 10 and a second inner bus extension 332 disposed on the second side of the semiconductor device 10. The first and second inner bus extensions 330 and 332 are connected to the first power pad 102. A third inner bus extension 334 is disposed on the first side of the semiconductor device 10 and a fourth inner bus extension 336 is disposed on the second side of the semiconductor device 10. The third and fourth inner bus extensions 334 and 336 are connected to the second power pad 104. The first and third inner bus extensions 330 and 334 overlap to define a first inner overlay region 340, and the second and third inner bus extensions 332 and 336 overlay to define a second inner overlay region 342. Power is provided to circuits connected to the second power network 300, such as the sense amplifier circuits 420, and the memory array 422 at or near the first and second inner overlay regions 340 and 342.

Additionally, within the first outer overlay region 240, the first outer bus extension 230 and the third outer bus extension 234 may comprise an interlayered bus structure as depicted in FIGS. 3–7. Likewise, within the second outer overlay region 242, the second outer bus extension 232 and the fourth outer bus extension 236 may comprise the interlayered bus structure as depicted in FIGS. 3–7. The first and second inner overlay regions 340 and 342 may also be constructed to comprise interlayered bus structure as depicted in FIGS. 3–7. In all other respects, the first and second power networks 200 and 300 may be constructed and may operate in a similar manner as described with reference to FIGS. 1–11.

Figure 13:
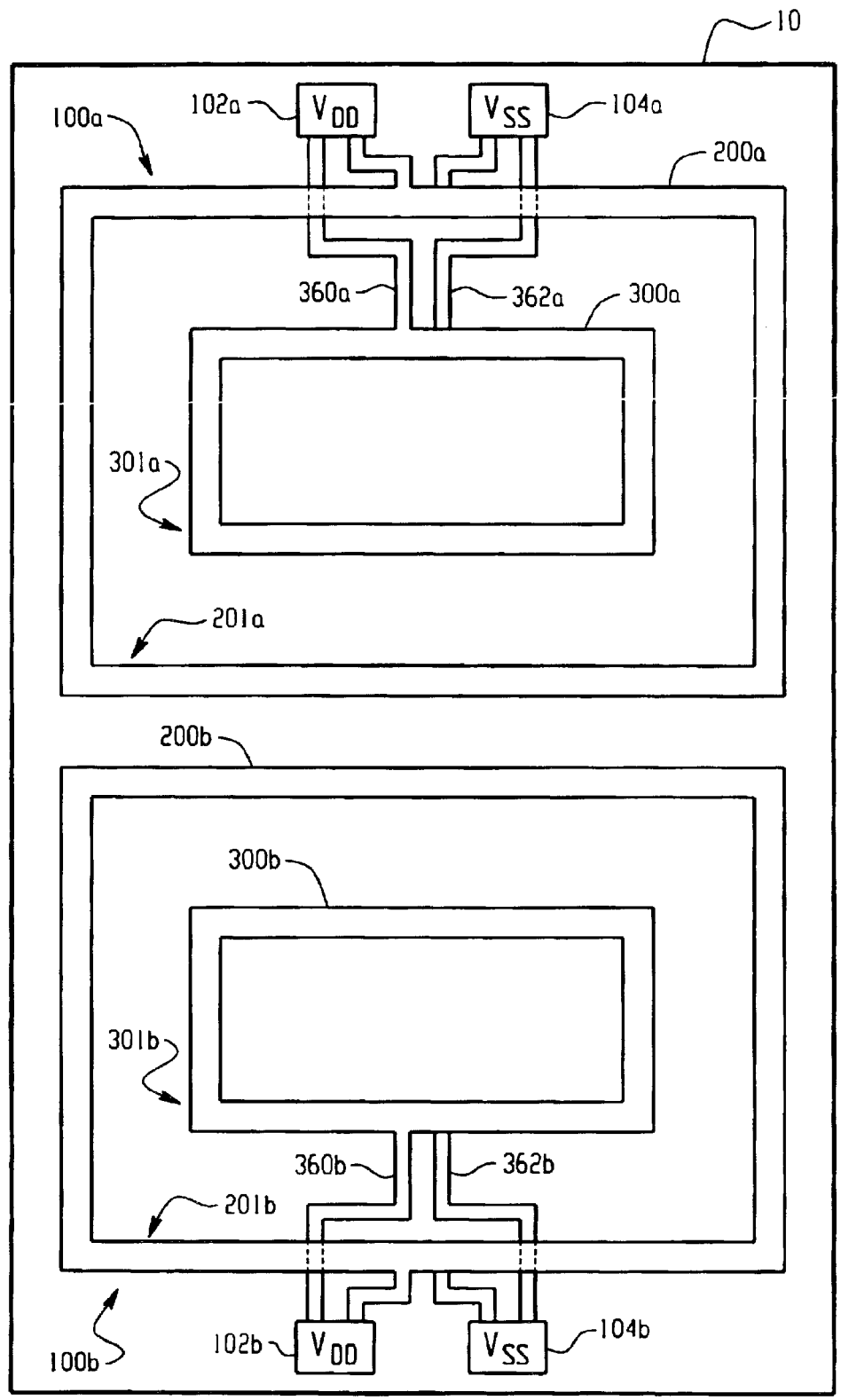
FIG. 13 is a block diagram of another embodiment of the power supply system comprising two subsystems in the semiconductor device.

More than one pair of first and second power networks 200 and 300 may be provided on a semiconductor device 10. FIG. 13 is a block diagram of another embodiment of the power supply system comprising two subsystems 100a and 100b in the semiconductor device 10. In this embodiment, a first power supply subsystem 100a provides power to a first section of the semiconductor device 10, and a second power supply subsystem 100b provides power to a second section of the semiconductor device 10.

Additionally, the embodiment of FIG. 13 also illustrates an alternate positioning of the first and second power pads 102 and 104. In this embodiment, the first and second power pads 102 and 104 are adjacent. The second power network 300 may be symmetrically disposed with respect to the first and second power pads 102 and 104 via bus leads 360 and 362. In all other respects, the first and second power networks 200 and 300 may be constructed and may operate in a similar manner as described with reference to FIGS. 1–12.

Of course, variations of the embodiments described herein exist. For example, depending on the architecture of the semiconductor device 10, noise inducing circuits can be powered by the second power network 300, and more sensitive circuits can be powered by the first power network 200. The interlayered bus of FIGS. 3–7 may also be extended to a plurality of layers in a multi-layered semiconductor device 10.

In another embodiment, only one of the third and fourth power busses 302 and 304 may be symmetrically disposed from the power pads 102 and 104. For example, if the first power bus 202 is noisy, but the second power bus 204 is relatively stable, then only the third power bus 302 may be symmetrically disposed from the first power pad 102.

In yet another embodiment, the first and second power networks 200 and 300 may define exclusive peripheries, i.e., neither the first or second power networks 200 and 300 are located within the periphery of the other. This particular embodiment may be implemented to accommodate a semiconductor device architecture in which circuits with a higher tolerance to power bus noise, or noise inducing circuits, are located on a first half of the semiconductor device, and noise sensitive circuits are located on a second half of the semiconductor device. Accordingly, the first power network 200 may provide power to the first half of the semiconductor device 10, and the second power network may provide power to the second half of the semiconductor device 10.

Finally, this written description uses examples to disclose the invention, including the best mode, and also to enable a person skilled in the art to make and use the invention. The patentable scope of the invention is defined by the claims, and may include other examples that occur to those skilled in the art. Such other examples are intended to be within the scope of the claims if they have elements that do not differ from the literal language of the claims, or if they include equivalent elements with insubstantial differences from the literal language of the claims.

What is claimed is:

1. A semiconductor device, comprising:
   a first power pad operable to supply a first potential;
   a second power pad operable to supply a second potential;
   a first adjacent bus pair disposed on a first layer of the semiconductor device, the first adjacent bus pair connected to the first and second power pads; and
   a second adjacent bus pair disposed on the second layer of the semiconductor device, the second adjacent bus pair connected to the first and second power pads and underlying the first adjacent bus pair in an elongated direction.

2. The semiconductor device of claim 1, wherein:
   the first adjacent bus pair comprises a first bus connected to the first power pad and a second bus connected to the second power pad; and
   the second adjacent bus pair comprises a third bus connected to the first power pad and a fourth bus connected to the second power pad.

3. The semiconductor device of claim 2, wherein the first bus is overlying the third bus.

4. The semiconductor device of claim 2, wherein the first bus is overlying the fourth bus.

5. The semiconductor device of claim 1, wherein:
   the first adjacent bus pair defines a first geometry; and
   the second adjacent bus pair defines a second geometry, the second geometry underlying the first geometry.

6. The semiconductor device of claim 5, wherein the first geometry and second geometry are rectangular.

7. The semiconductor device of claim 5, wherein the first geometry and second geometry are circular.

8. The semiconductor device of claim 1, wherein the first and second adjacent bus pairs comprise bus extensions extending from the first and second power pads and define overlay regions.

* * * * *